United States Patent
Koyama et al.

(10) Patent No.: US 9,162,249 B2
(45) Date of Patent: Oct. 20, 2015

(54) PASTE DISPENSER FOR APPLYING PASTE CONTAINING FILLERS USING NOZZLE WITH PIN AND APPLICATION METHOD USING THE SAME

(75) Inventors: Masayoshi Koyama, Osaka (JP); Norihito Tsukahara, Kyoto (JP); Daido Komyoji, Nara (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 1305 days.

(21) Appl. No.: 12/568,347

(22) Filed: Sep. 28, 2009

(65) Prior Publication Data

US 2010/0080912 A1 Apr. 1, 2010

(30) Foreign Application Priority Data

Oct. 1, 2008 (JP) ................................. 2008-255868
Dec. 26, 2008 (JP) ................................. 2008-332540

(51) Int. Cl.

| B05C 1/00 | (2006.01) |
|---|---|
| B05C 11/00 | (2006.01) |
| B05C 11/10 | (2006.01) |
| B23K 1/00 | (2006.01) |
| B23K 3/06 | (2006.01) |
| H05K 3/34 | (2006.01) |
| C23C 14/54 | (2006.01) |
| G01F 11/20 | (2006.01) |
| G01F 11/00 | (2006.01) |
| B05C 5/02 | (2006.01) |

(Continued)

(52) U.S. Cl.
CPC ........... *B05C 11/1034* (2013.01); *B05C 5/0225* (2013.01); *B23K 1/0016* (2013.01); *B23K 3/0692* (2013.01); *H05K 3/3484* (2013.01); *B05C 5/02* (2013.01); *B05C 5/0212* (2013.01); *B05C 9/02* (2013.01); *B05D 1/26* (2013.01); *B05D 3/0466* (2013.01); *B23K 2201/40* (2013.01); *G01F 11/00* (2013.01); *H05K 2203/0126* (2013.01)

(58) Field of Classification Search
CPC B05B 1/3046; B05C 5/0025; B05C 11/1034; B05C 5/0237; B05C 5/0279; H01L 21/56; H01L 24/743; G01F 11/021; H05K 13/0469; H05K 2203/0126; H05K 3/3484; H05K 3/1241; B23K 1/203; B23K 3/06; B29B 9/00; Y10S 118/03
USPC ........ 118/401, 241, 684; 228/248.1; 222/333, 222/504, 420, 422, 518; 427/256, 207.1
See application file for complete search history.

(56) References Cited

U.S. PATENT DOCUMENTS 2,296,079 A * 9/1942 Helmer Anderson ......... 239/118
3,164,304 A * 1/1965 Holger et al. ................. 222/192

(Continued)

FOREIGN PATENT DOCUMENTS

JP 01-159077 6/1989
JP 2-6166 1/1990

(Continued)

*Primary Examiner* — Karl Kurple
(74) *Attorney, Agent, or Firm* — Hamre, Schumann, Mueller & Larson, P.C.

(57) ABSTRACT

A pin (125) is moved down in a nozzle (121), the end of paste (101) protruded from the discharge opening (122) of the nozzle (121) to a target object (102) is brought into contact with the target object (102), and the pin (125) is moved away from the discharge opening (122) to divide the paste in contact with the target object.

12 Claims, 9 Drawing Sheets

(51) Int. Cl.
*B05C 9/02* (2006.01)
*B05D 1/26* (2006.01)
*B05D 3/04* (2006.01)

(56) References Cited

U.S. PATENT DOCUMENTS

| | | | | |
|---|---|---|---|---|
| 3,334,354 A * | 8/1967 | Mutschler | ................ | 346/140.1 |
| 3,702,748 A * | 11/1972 | Storb | ................ | 425/6 |
| 3,933,187 A * | 1/1976 | Marlinski | ................ | 141/392 |
| 4,784,582 A * | 11/1988 | Howseman, Jr. | ................ | 417/375 |
| 4,848,606 A * | 7/1989 | Taguchi et al. | ................ | 222/333 |
| 4,904,499 A * | 2/1990 | Shimizu | ................ | 427/207.1 |
| 4,916,805 A * | 4/1990 | Ellrich et al. | ................ | 156/272.2 |
| 4,935,261 A * | 6/1990 | Srivastava et al. | ................ | 427/10 |
| 4,938,383 A * | 7/1990 | Yamazaki et al. | ................ | 222/41 |
| 4,942,984 A * | 7/1990 | Miller | ................ | 222/309 |
| 5,042,688 A * | 8/1991 | Srivastava et al. | ................ | 222/55 |
| 5,074,443 A * | 12/1991 | Fujii et al. | ................ | 222/639 |
| 5,186,982 A * | 2/1993 | Blette et al. | ................ | 427/98.4 |
| 5,195,656 A * | 3/1993 | Briehl et al. | ................ | 222/1 |
| 5,320,250 A * | 6/1994 | La et al. | ................ | 222/1 |
| 5,348,585 A * | 9/1994 | Weston | ................ | 118/305 |
| 5,404,050 A * | 4/1995 | Nauta | ................ | 327/100 |
| 5,405,050 A * | 4/1995 | Walsh | ................ | 222/1 |
| 5,465,879 A * | 11/1995 | La et al. | ................ | 222/189.06 |
| 5,747,102 A * | 5/1998 | Smith et al. | ................ | 427/98.4 |
| 5,819,983 A * | 10/1998 | White et al. | ................ | 222/1 |
| 5,834,062 A * | 11/1998 | Johnson et al. | ................ | 427/58 |
| 5,909,839 A * | 6/1999 | Belke, Jr. et al. | ................ | 228/248.1 |
| 5,913,455 A * | 6/1999 | La et al. | ................ | 222/55 |
| 5,927,560 A * | 7/1999 | Lewis et al. | ................ | 222/263 |
| 6,092,691 A * | 7/2000 | Schuerholz et al. | ................ | 222/1 |
| 6,250,515 B1 * | 6/2001 | Newbold et al. | ................ | 222/504 |
| 6,296,702 B1 * | 10/2001 | Bryning et al. | ................ | 118/401 |
| 6,378,737 B1 * | 4/2002 | Cavallaro et al. | ................ | 222/309 |
| 6,405,672 B1 * | 6/2002 | De Mol et al. | ................ | 119/14.15 |
| 6,467,700 B2 * | 10/2002 | Vann et al. | ................ | 239/225.1 |
| 6,527,905 B1 * | 3/2003 | Imanishi et al. | ................ | 156/291 |
| 6,610,364 B1 | 8/2003 | Kweon et al. | | |
| 6,739,483 B2 * | 5/2004 | White et al. | ................ | 222/413 |
| 6,854,712 B2 * | 2/2005 | Rohwer et al. | ................ | 251/318 |
| 7,735,695 B2 * | 6/2010 | Ikushima | ................ | 222/333 |
| 7,745,741 B2 * | 6/2010 | Kweon et al. | ................ | 177/59 |
| 7,762,088 B2 * | 7/2010 | Fiske et al. | ................ | 62/3.64 |
| 7,887,874 B2 * | 2/2011 | Weiss et al. | ................ | 427/8 |
| 7,894,919 B2 * | 2/2011 | Weiss et al. | ................ | 700/19 |
| 7,964,237 B2 * | 6/2011 | Weiss et al. | ................ | 427/98.4 |
| 7,980,197 B2 * | 7/2011 | Prentice et al. | ................ | 118/688 |
| 8,052,013 B2 * | 11/2011 | Kweon et al. | ................ | 222/400.5 |
| 8,056,833 B1 * | 11/2011 | Fugere | ................ | 239/436 |
| 8,408,421 B2 * | 4/2013 | Diperna | ................ | 222/4 |
| 8,448,818 B2 * | 5/2013 | Ikushima | ................ | 222/1 |
| 8,480,015 B1 * | 7/2013 | Fugere | ................ | 239/591 |
| 8,534,499 B2 * | 9/2013 | Williams et al. | ................ | 222/55 |
| 8,690,084 B1 * | 4/2014 | Fugere | ................ | 239/597 |
| 8,701,946 B1 * | 4/2014 | Fugere | ................ | 222/413 |
| 8,708,246 B2 * | 4/2014 | Dunlap et al. | ................ | 239/1 |
| 8,721,589 B1 * | 5/2014 | Stanhope et al. | ................ | 604/96.01 |
| 8,753,713 B2 * | 6/2014 | Clark et al. | ................ | 427/208.2 |
| 2003/0066546 A1 * | 4/2003 | Bibeault et al. | ................ | 134/21 |
| 2004/0081759 A1 | 4/2004 | Maruyama et al. | | |
| 2004/0131758 A1 | 7/2004 | Jung et al. | | |
| 2004/0188495 A1 * | 9/2004 | Enochs et al. | ................ | 228/42 |
| 2006/0257199 A1 | 11/2006 | Sogaro | | |
| 2009/0078720 A1 * | 3/2009 | Abernathy et al. | ................ | 222/1 |
| 2009/0107398 A1 * | 4/2009 | Hassler et al. | ................ | 118/315 |

FOREIGN PATENT DOCUMENTS

| | | |
|---|---|---|
| JP | 02-205501 | 8/1990 |
| JP | 05-057222 | 3/1993 |
| JP | 5-60567 | 8/1993 |
| JP | 2000-22320 | 1/2000 |
| JP | 2001-144112 | 5/2001 |
| JP | 2006-320795 | 11/2006 |

* cited by examiner

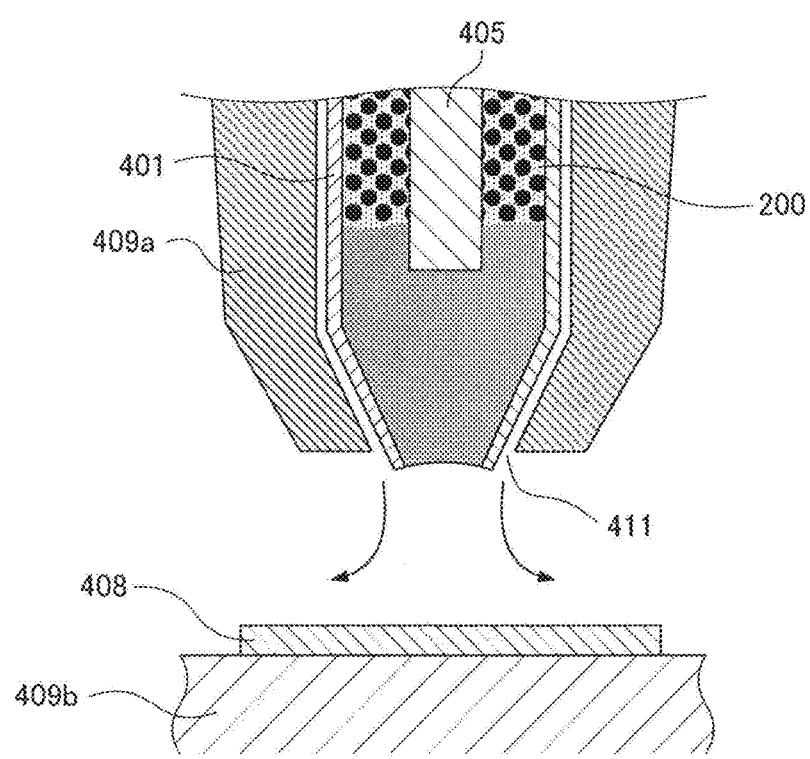

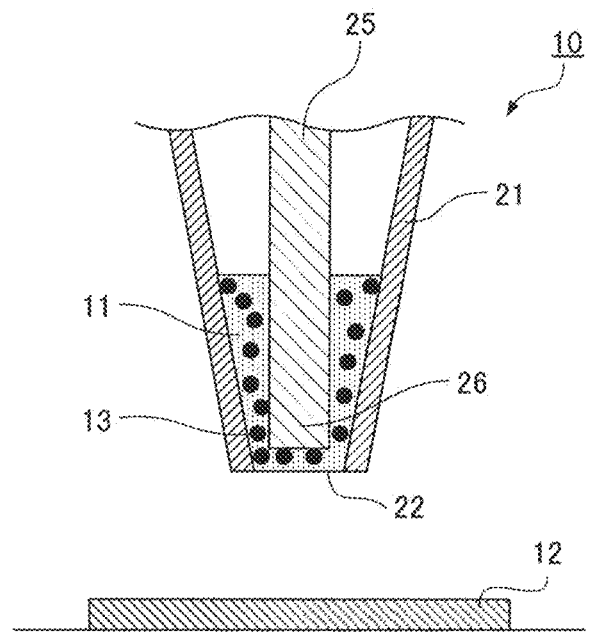

PASTE DISPENSER FOR APPLYING PASTE CONTAINING FILLERS USING NOZZLE WITH PIN AND APPLICATION METHOD USING THE SAME

FIELD OF THE INVENTION

The present invention relates to a paste applicator for stably applying a small amount of paste to a target object, and a paste application method.

BACKGROUND OF THE INVENTION

In recent years, electronic equipment with a smaller size, a smaller thickness, and a higher density has been demanded. In order to manufacture electronic equipment satisfying such a demand, a method of mounting small electronic components on a substrate by flip-chip packaging has been used. As electronic components have been reduced in size, bumps have been also reduced in size with smaller pitches. Hence, it has been necessary to stably apply a small amount of solder paste to small bumps with small pitches.

Japanese Patent Laid-Open No. 2006-320795 discloses a discharge device for discharging small droplets having even particle diameters into a retained solution, though the device does not apply paste used for the mounting of electronic equipment.

DISCLOSURE OF THE INVENTION

The device of Japanese Patent Laid-Open No. 2006-320795 is considered to be usable for applying paste used for the mounting of electronic equipment. In other words, the paste can be applied by transferring a liquid, which has been put on the end of a tungsten pin, to a target object.

To be specific, as shown in FIGS. 9A to 9D, a paste applicator 10 applies paste 11, which has been put on an end 26 of a tungsten pin 25, to a target object 12. As shown in FIG. 9A, an opening 22 formed on the end of a nozzle 21 is disposed at a predetermined height from the surface of the target object 12. As shown in FIG. 9B, the pin 25 moves down in the paste 11 having been put in the nozzle 21. As shown in FIG. 9C, the end 26 of the pin 25 protrudes out of the opening 22 with a small amount of the paste 11 put on the end 26 of the pin 25. As shown in FIG. 9D, the paste 11 put on the end 26 of the pin 25 moves down until the paste 11 comes into contact with the target object 12. The paste 11 put on the end 26 of the pin 25 is applied to the target object 12.

However, when the paste 11 contains solder powder, the paste applicator 10 may cause faulty application or an unstable amount of application. In this configuration, as an example, the paste 11 containing solder powder and resin with a compounding ratio of 50 wt %, has been put into the nozzle 21.

For example, as shown in FIG. 10, it is assumed that a clearance between the opening 22 of the nozzle 21 and the end 26 of the pin 25 is smaller than the diameter of solder powder 13 contained in the paste 11. In this case, when the end 26 of the pin 25 passes through the opening 22 of the nozzle 21, the solder powder enters the clearance between the end 26 of the pin 25 and the opening 22 of the nozzle 21. Thus the descending operation of the pin 25 is interrupted. Further, the pin 25 may be bent or the nozzle 21 may be broken. As a result, the applicator may have a malfunction or a failure and the paste 11 may not be applied onto the target object 12, causing faulty application.

As shown in FIGS. 11A to 11C, it is assumed that a clearance between the opening 22 of the nozzle 21 and the end 26 of the pin 25 is larger than the diameter of the solder powder 13 contained in the paste 11. In this case, when the pin 25 moves up after the completion of application, the paste 11 put on the side wall of the pin 25 is scraped by the opening 22 of the nozzle 21, so that a paste droplet 14 is formed on the opening 22 of the nozzle 21 as shown in FIG. 11B.

Thus when the pin 25 is moved down to apply the paste onto the subsequent application point, the paste droplet 14 formed on the opening 22 of the nozzle 21 is added to the end 26 of the pin 25. Hence, the paste 11 is put on the end 26 of the pin 25 with a larger amount than the amount of application on the previous application point, resulting in a larger amount of application. The amount of application varies thus among application points, resulting in an unstable amount of application.

An object of the present invention is to provide a paste applicator and a paste application method which can stably apply even a small amount of paste, which contains a filler such as solder powder, to a target object such as a substrate.

Another object of the present invention is to provide a paste applicator and a paste application method which can satisfactorily form bumps on a target object such as a substrate.

A paste applicator of the present invention includes: a nozzle which has a discharge opening formed on the end, is disposed above a target object with the discharge opening placed at the bottom, is filled with paste, and is relatively moved toward and away from the target object; and a pin which is disposed in the nozzle, moves toward and away from the discharge opening, and does not protrude from the discharge opening to the outside of the nozzle, wherein while the discharge opening of the nozzle comes close to the target object, the pin is brought close to the discharge opening and the paste protruded to the target object so as not to drip from the discharge opening is brought into contact with the target object, and in a relative movement increasing a distance between the nozzle and the target object, the pin is moved away from the discharge opening and the paste in contact with the target object is divided from the paste around the discharge opening.

A paste application method according to the present invention includes the steps of: placing a nozzle which has a discharge opening formed on the end, is disposed above a target object with the discharge opening placed at the bottom, and is filled with paste, the nozzle being placed such that the nozzle is relatively moved toward and away from the target object and the discharge opening comes close to the target object; applying the paste to the target object by bringing a pin close to the discharge opening while the discharge opening of the nozzle comes close to the target object and bringing the paste into contact with the target object, the paste being protruded to the target object so as not to drip from the discharge opening; and separating the paste in contact with the target object from the paste around the discharge opening by moving the pin away from the discharge opening in a relative movement increasing a distance between the nozzle and the target object.

Preferably, the paste is applied into a plurality of points on the target object by repeating the application and the separation on varying application points.

Preferably, the paste is applied into a line on the target object by repeating the application and the separation on varying application points such that the application points overlap each other.

Further, a paste application method according to the present invention includes the steps of: supplying paste containing a filler to a nozzle and heating the paste in the nozzle to at least the melting point of the filler; placing the discharge opening of the nozzle above an application position of a target object; applying the end of the molten filler to the target object, the filler being protruded from the discharge opening of the nozzle and brought into contact with the target object by moving a pin in the nozzle without bringing the pin into contact with the discharge opening in the nozzle or protruding the pin out of the nozzle; dividing, from the molten filler in the nozzle, the molten filler protruded from the discharge opening of the nozzle by lifting the pin to an upper position; and separating the nozzle from the application position of the target object after the completion of application.

Preferably, in the application and the division, the molten filler protruded from the discharge opening of the nozzle has a surface kept in inert gas.

Further, a paste applicator of the present invention includes a nozzle having a discharge opening formed at the bottom, a pin which is disposed in the nozzle, moves toward and away from the discharge opening, and does not protrude from the discharge opening to the outside of the nozzle, a driving section connected to the pin to move up and down the pin; an elevator mount for ascending and descending the nozzle, the pin, and the driving section; and a heating section for heating paste containing a filler in the nozzle to at least the melting point of the filler, wherein while the discharge opening of the nozzle comes close to a target object, the pin is brought close to the discharge opening and the end of the molten filler protruded to the target object so as not to drip from the discharge opening is brought into contact with the target object, and the pin is moved away from the discharge opening to divide, from the molten filler in the nozzle, the molten filler protruded from the discharge opening of the nozzle.

Preferably, a plurality of bumps are formed on the target object by repeating the placement, the application, and the separation.

Preferably, the applicator further includes a mechanism for covering, with inert gas, the surface of the molten filler protruded from the discharge opening of the nozzle.

Preferably, in the paste applicator of the present invention, the pin has an end shaped such that a larger resistance is applied from the paste when the pin is moved up than when the pin is moved down. Preferably, in the paste application method of the present invention, the pin has an end shaped such that a larger resistance is applied from the paste when the pin is moved up than when the pin is moved down.

Preferably, in the paste applicator and the paste application method of the present invention, at a position where the discharge opening of the nozzle is close to the target object, a height from the surface of the target object to the discharge opening is in a range from 0.5 times to 1.5 times as large as the bore of the discharge opening.

Preferably, in the paste applicator and the paste application method of the present invention, the pin moves in the paste in the division at a velocity (V1) not lower than a velocity (V2) of the pin moving in the paste in the application. More preferably, V1 is at least twice as high as V2.

According to the present invention, the end of the pin is not moved out of the discharge opening of the nozzle but is vertically moved in the paste having been put into the nozzle. Thus problems do not arise unlike in the case where the end of the pin protrudes out of the discharge opening of the nozzle.

For example, it is assumed that the paste contains solder powder. In this case, the solder powder contained in the paste does not enter a clearance between the discharge opening of the nozzle and the end of the pin, so that the descending operation of the pin is not interrupted, the pin is not bent, or the nozzle is not broken. In other words, the applicator hardly has a malfunction or a failure, so that faulty application hardly occurs.

Since the end of the pin is not moved out of the discharge opening of the nozzle, the paste put on the side wall of the end is not scraped by the discharge opening. Thus a paste droplet is not formed on the discharge opening of the nozzle, so that the paste is put on the end of the pin with a constant amount and the amount of application hardly exceeds the amount of application of the previous point.

Hence, the paste applicator can stably apply a small amount of the paste, which contains a filler such as the solder powder, to the target object such as a substrate.

The paste applicator and the paste application method include the heating section and the step of supply by which the paste containing a filler is supplied to the nozzle and the paste in the nozzle is heated to at least the melting point of the filler, thereby satisfactorily forming bumps on the surface of the target object.

BRIEF DESCRIPTION OF THE DRAWINGS

FIG. 5 is a side view around the nozzle of a paste applicator according to a second embodiment of the present invention;

FIG. 10 is a sectional view showing the problem of solder powder entering a clearance between the end of a pin and a discharge opening;

DESCRIPTION OF THE EMBODIMENTS

First Embodiment

As shown in FIGS. 1A to 1D, a paste applicator 100 is a device for discharging a small amount of paste 101.

Figure 1A:
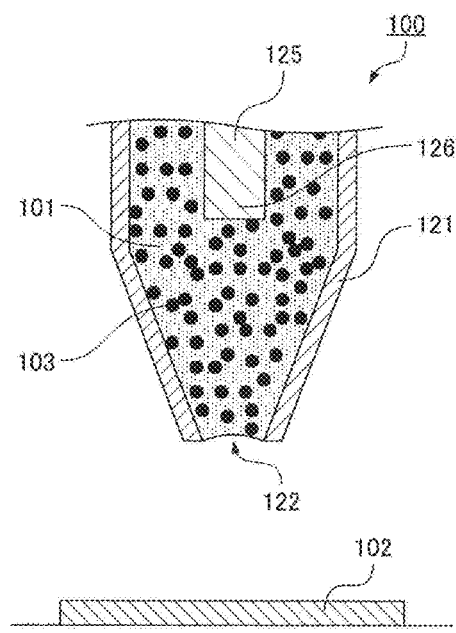
FIG. 1A is a sectional view showing the applying operation of a paste applicator according to an embodiment.

As shown in FIG. 1A, a discharge opening 122 is formed on the end of a nozzle 121. The nozzle 121 is disposed above a target object 102 with the discharge opening 122 placed at the bottom. The paste 101 has been put into the nozzle 121. The paste 101 contains solder powder 103. In the paste 101 having been put into the nozzle 121, an end 126 of a vertically disposed pin 125 is placed.

Figure 1B:
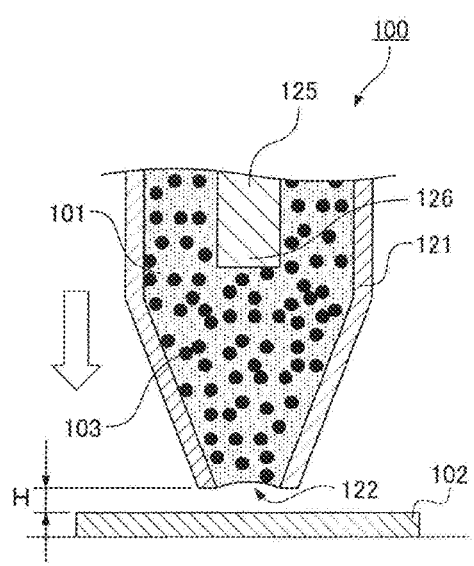
FIG. 1B is a sectional view showing the applying operation of the paste applicator according to the embodiment.
Figure 1C:
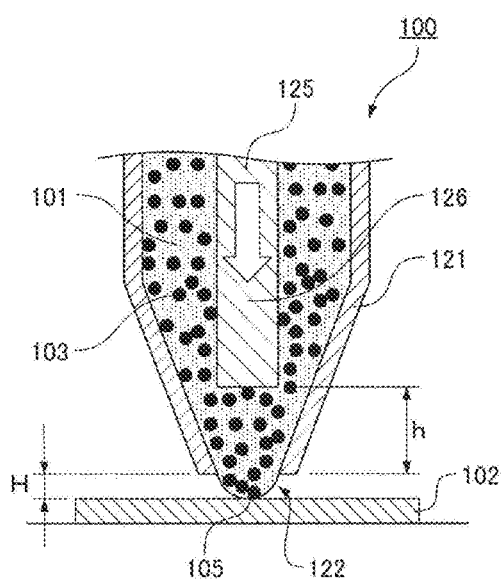
FIG. 1C is a sectional view showing the applying operation of the paste applicator according to the embodiment.
Figure 1D:
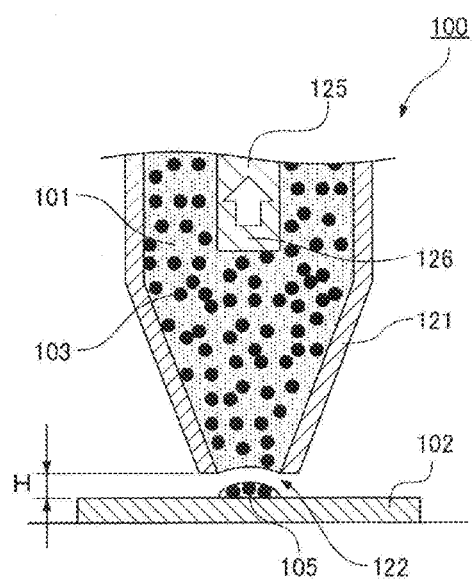
FIG. 1D is a sectional view showing the applying operation of the paste applicator according to the embodiment.

First, as shown in FIG. 1B, the nozzle 121 is moved down until the discharge opening 122 is disposed within a distance H from the surface of the target object 102. The discharge opening 122 is stopped within the distance H from the surface of the target object 102; meanwhile, the pin 125 is moved down as shown in FIG. 1C, the paste 101 is protruded from the discharge opening 122 to the outside of the nozzle 121, and an end 105 of the protruded paste 101 is brought into contact with the target object 102. After that, as shown in FIG. 1D, the pin 125 is moved up such that the end 105 of the paste 101 in contact with the target object 102 is divided from the paste 101 having been put around the discharge opening 122.

Figure 2:
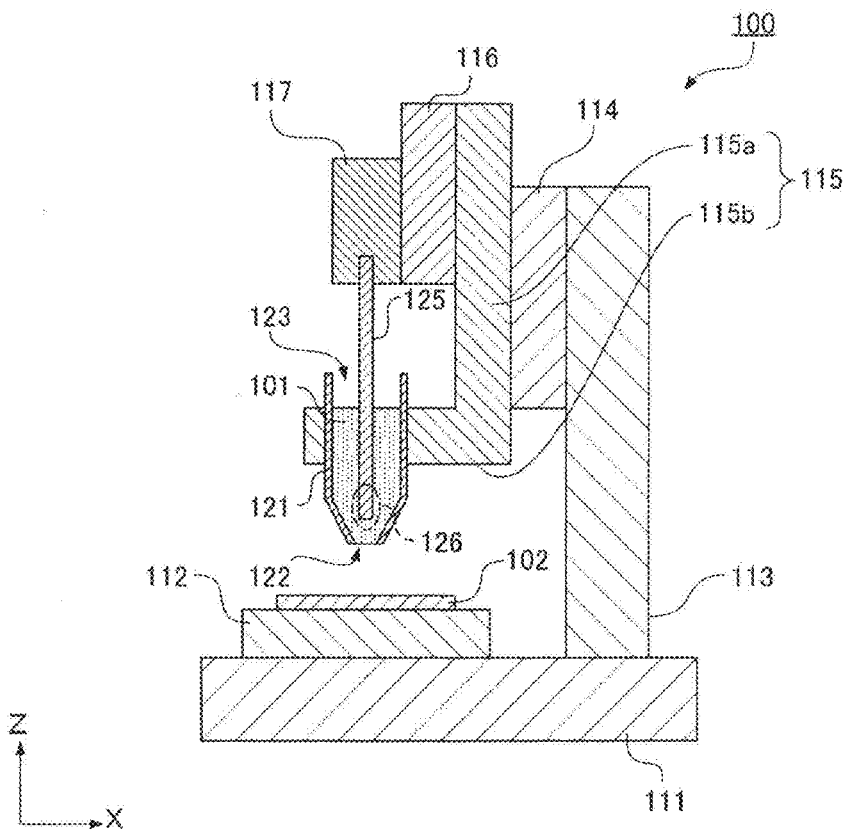
FIG. 2 is a side view showing the paste applicator according to the embodiment.

In this configuration, as an example, the paste applicator 100 includes a base 111, an elevator mount 115, the nozzle 121, and the pin 125 as shown in FIG. 2.

The base 111 is a horizontally extended base. In FIG. 2, on the left side of the top surface of the base 111, a stage 112 on which the target object 102 is placed is attached so as to be horizontally movable in the X-axis direction and the Y-axis direction. Further, on the right side of the top surface of the base 111, the proximal end of a supporter 113 extending upward in the vertical direction is fixed. On the left side of the upper part of the supporter 113, an elevator mount slider 114 having a vertically slidable portion is formed.

The elevator mount 115 attached to the base 111 via the elevator mount slider 114 has a vertical part 115a extending in the vertical direction and a horizontal part 115b extending in the horizontal direction. In FIG. 2, the horizontal part 115b is disposed above the stage 112. The vertical part 115a is attached to the elevator mount slider 114 so as to move in the vertical direction with the horizontal part 115b disposed under the vertical part 115a. The nozzle 121 is held by the horizontal part 115b. On the left side of the upper part of the vertical part 115a, a slider fixing member 116 having a vertically slidable portion is fixed. On the left side of the slider fixing member 116, a slider moving part 117 movable perpendicularly to the slider fixing member 116 is attached. The upper end of the pin 125 is attached to the slider moving part 117.

The stage 112, the elevator mount 115, and the slider moving part 117 are moved up and down by a driving mechanism (not shown) including a driving source such as a pulse motor and an air cylinder. For example, when the driving source is a pulse motor, a current supplied to the pulse motor is controlled according to the number of pulses corresponding to the lead of a feed screw. When the driving source is an air cylinder, a pressure of air supplied to the air cylinder is controlled by combining a position sensor, a stopper and the like.

The nozzle 121 placed in the horizontal part 115b of the elevator mount 115 is circular in cross section, is shaped like a pipe having a tapered end, and is a container made of glass or resin. The discharge opening 122 is formed on one end of the nozzle 121. On the other end of the nozzle 121, an opening 123 is formed where the pin 125 can move in and out. The paste 101 is put into the nozzle 121 and the nozzle 121 is disposed above the stage 112 with the discharge opening 122 disposed at the bottom.

The pin 125 having one end put into the nozzle 121 and the other end attached to the slider moving part 117 is a tungsten pin circular in cross section. The axis of the pin 125 is disposed on the axis of the nozzle 121. The end 126 is placed into the paste 101 having been put into the nozzle 121, and the pin 125 is vertically moved in the paste 101 by the movement of the slider moving part 117 during application.

Figure 3A:
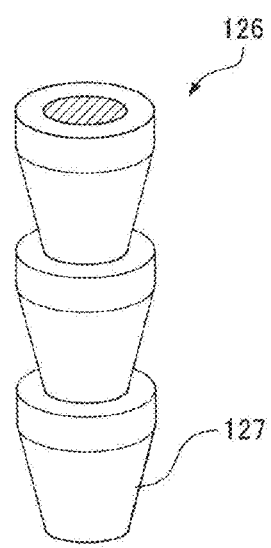
FIG. 3A is an enlarged view of the end of a pin according to the embodiment.

According to the shape of the end 126 of the pin 125, a resistance applied from the paste 101 by the ascending pin 125 in the paste 101 is larger than a resistance applied from the paste 101 by the descending pin 125 in the paste 101. In this case, as an example, the end 126 of the pin 125 includes tapered portions 127 which are connected and gradually reduced in diameter toward the ends as shown in FIG. 3A.

Figure 3B:
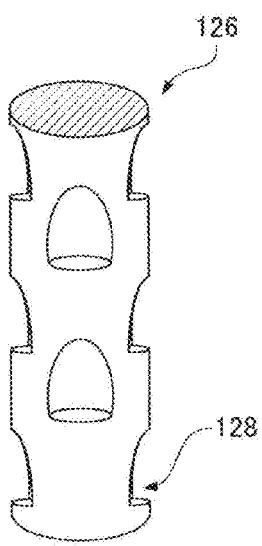
FIG. 3B is an enlarged view showing another example of the end of the pin.

Further, the end 126 of the pin 125 may include a single tapered portion 127 which is gradually reduced in diameter toward the end. Moreover, as shown in FIG. 3B, the end 126 may partially include recessed portions 128 which are deeply cut toward the ends.

The following will describe the operation of the paste applicator 100.

In this operation, as an example, the paste 101 is resin containing solder powder, which has an average particle diameter of 20 μm, with a compounding ratio of 50 wt % and the paste 101 has a viscosity of 20 Pa·s. Preferably, the nozzle 121 is a container having an inside diameter of 1.9 mm and the end of the nozzle 121 is thermoformed into a tapered shape and is cut into a flat shape to form the discharge opening 122 having a bore of 0.3 mm. The pin 125 preferably has a diameter of 0.3 mm. As shown in FIG. 3A, the pin 125 has the end 126 including the tapered portions 127 which are connected and gradually reduced in diameter toward the ends. The pin 125 moves up and down at a constant speed.

The paste 101 has been put into the nozzle 121 beforehand. The nozzle 121 filled with the paste 101 is disposed above the target object 102. The end 126 of the pin 125 has been put into the paste 101. The target object 102 is horizontally moved to shift an application point below the nozzle 121. At this point, as shown in FIG. 1A, the paste 101 around the discharge opening 122 is slightly dented inward from the discharge opening 122 of the nozzle 121 by the action of a surface tension. Thus the paste 101 is stably retained inside the nozzle 121 without dripping or leaking from the discharge opening 122.

First, the elevator mount 115 is moved down along the elevator mount slider 114. At this point, as shown in FIG. 1B, the elevator mount 115 is moved down until the discharge opening 122 of the nozzle 121 reaches a position at the distance H above the surface of the target object 102. Accordingly, the nozzle 121 and the pin 125 are simultaneously moved down. In this case, as an example, the distance H is 0.15 mm, which is 0.5 times as large as the bore of the discharge opening 122.

Next, the slider moving part 117 is moved down along the slider fixing member 116. At this point, as shown in FIG. 1C, the slider moving part 117 is moved down at a velocity of, for example, 2 mm/second until the end 126 of the pin 125 reaches a position at a distance h above the discharge opening 122 of the nozzle 121. Accordingly, the end 126 of the pin 125 moves down while receiving a resistance from the paste 101. The (tapered) shape of the end of the nozzle 121 increases the fluid pressure of the paste 101 below the pin 125. The fluid pressure increased by the descending pin 125 brings the end 105 of the paste 101 into contact with the target object 102. The end 105 is a part of the paste 101 protruded from the discharge opening 122 to the target object 102. In this configuration, as an example, the distance h between the end of the pin 125 and the discharge opening 122 is 1 mm at this point.

Next, the slider moving part 117 is moved up along the slider fixing member 116. At this point, as shown in FIG. 1D, the slider moving part 117 is moved up at a velocity of, for example, 2 mm/second until the end 126 of the pin 125 reaches a position where the end 126 has been disposed before the pin 125 moves down. Accordingly, the paste 101 around the discharge opening 122 is retracted by force into the nozzle 121, and the end 105 of the paste 101 in contact with the target object 102 is divided from the paste 101 around the discharge opening 122.

The paste 101 retracted into the nozzle 121 has a self weight and a surface tension in balance and is brought to a state before the pin 125 is moved down, so that the paste 101 does not drip from the discharge opening 122.

After a small amount of the paste 101 is applied thus to the target object 102, the stage 112 is moved to shift the subsequent application point on the target object 102 to a position below the nozzle 121.

The bore of the discharge opening 122 and the diameter of the pin 125 are optimally set according to the dimensions of bumps. For example, as a specific example, in the case where the paste 101 applied to the target object 102 was about 0.3 mm in diameter and about 0.1 mm in height under the foregoing conditions, the solder powder 103 was observable in the paste 101 applied to the target object 102.

The distance H is preferably 0.5 times to 1.5 times as large as the bore of the discharge opening 122. When the distance H is smaller than this range, the paste is expanded. When the distance H is larger than this range, the paste has to be applied with a larger amount.

The shape of the paste 101 protruding from the discharge opening 122 to the outside of the nozzle 121 is determined in connection with a number of parameters including the properties of the paste 101, the shape of the nozzle 121, the bore of the discharge opening 122, and the shape, size, and velocity of the pin 125. Further, the shape of the paste 101 is changed by a fluid pressure. For example, a high fluid pressure forms the paste into an expanded hemisphere. Further, a low fluid pressure forms the paste into a shrunk hemisphere. The expanded hemisphere is likely to be dripped by the self weight, and the shrunk hemisphere may become unstable by the surface tension.

When the pin 125 is moved up and separated as shown in FIGS. 1C to 1D, the pin 125 may be moved up at a higher velocity as long as air bubbles do not enter from the discharge opening 122 of the nozzle 121. Also in this case, the paste 101 around the discharge opening 122 is retracted by force into the nozzle 121 as the pin 125 moves up, so that a droplet of the paste 101 in contact with the target object 102 is more quickly separated by the discharge opening 122.

In the foregoing example, the pin 125 may be moved down at a velocity of 2 mm/second and moved up at a velocity of 4 mm/second. In this case, the paste was satisfactorily divided and was applied with high accuracy.

In this way the paste can be satisfactorily applied. In this application process, the end 126 of the pin 125 is not moved out of the discharge opening 122 of the nozzle 121 but is vertically moved in the paste 101 having been put into the nozzle 121. Thus problems do not arise unlike in the case where the end 126 of the pin 125 protrudes out of the discharge opening 122 of the nozzle 121.

For example, it is assumed that the paste 101 contains the solder powder 103. In this case, the solder powder 103 contained in the paste 101 does not enter a clearance between the discharge opening 122 of the nozzle 121 and the end 126 of the pin 125, so that the descending operation of the pin 125 is not interrupted, the pin 125 is not bent, or the nozzle 121 is not broken. In other words, the applicator hardly has a malfunction or a failure, so that faulty application hardly occurs.

Since the end 126 of the pin 125 is not moved out of the discharge opening 122 of the nozzle 121, the paste 101 put on the side wall of the end 126 is scraped by the discharge opening 122 and is not applied outside the discharge opening 122. Thus a paste droplet is not formed on the discharge opening 122 of the nozzle 121, so that the paste 101 is put on the end 126 of the pin 125 with a constant amount and the amount of application hardly exceeds the amount of application of the previous point.

With these operations, the paste applicator 100 can stably apply a small amount of the paste 101, which contains a filler such as the solder powder 103, to the target object 102 such as a substrate.

Figure 4A:
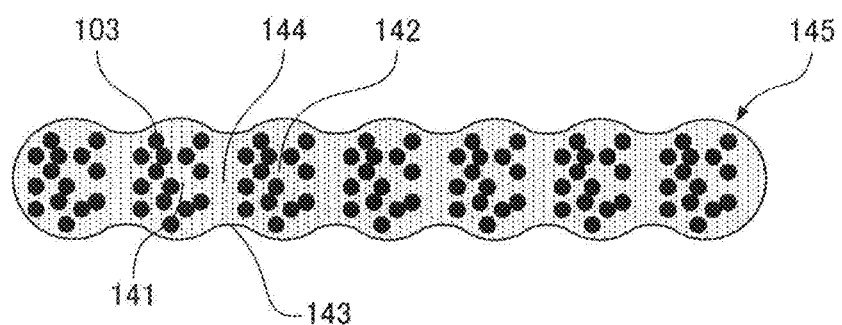
FIG. 4A shows a state of application of paste according to a modification of the embodiment.

In the foregoing explanation, the paste is applied like points. The paste may be applied like a line. To be specific, after the paste 101 is applied to the target object 102, the stage 112 is horizontally moved such that the subsequent paste overlaps the applied paste 101. The paste is applied to the subsequent application position. By repeating this operation, the paste is linearly applied on a part of the target object 102. At this point, as shown in FIG. 4A, when the paste is applied so as to slightly overlap the previously applied paste 101, a constriction 143 appears between an application point 141 and an application point 142. The distribution of the solder powder 103 decreases on a constricted portion 144 and the solder powder 103 is unevenly applied onto a linear application portion 145.

Figure 4B:
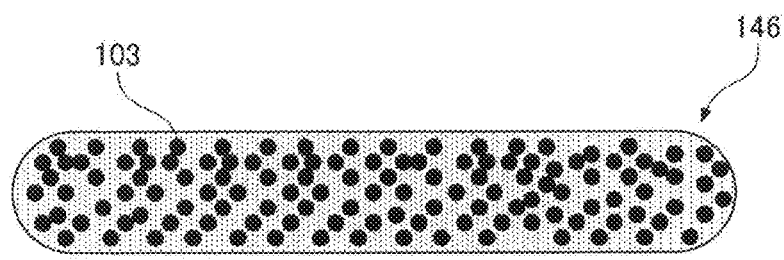
FIG. 4B shows a state of application of the paste according to a modification of the embodiment.

As shown in FIG. 4B, when an overlap with the previously applied paste is at least a half of an application diameter, the constriction 143 of FIG. 4A is eliminated and the solder powder 103 on a linear application portion 146 is substantially evenly distributed. Thus the paste can be applied like a straight line or a curve with a small width.

In the embodiment of the present invention, the solder powder is used as a filler contained in the paste 101. The present invention is not limited by the material, particle diameter, and shape of the filler, a compounding ratio, the viscosity of the paste, and so on. The present invention is also useful for a liquid containing no fillers.

In the foregoing embodiment, the nozzle 121 is moved up or down relative to the target object 102 to increase or reduce a distance between the target object 102 and the discharge opening 122 of the nozzle 121. The target object 102 may be moved up or down relative to the nozzle 121 to change a distance between the target object 102 and the discharge opening 122 of the nozzle 121, or both of the nozzle 121 and the target object 102 may be moved to change a distance between the target object 102 and the discharge opening 122 of the nozzle 121. A distance between the target object 102 and the discharge opening 122 of the nozzle 121 is changed by relatively moving the target object 102 and the nozzle 121.

Second Embodiment

FIG. 5 shows an example of the formation of a solder bump. FIG. 5 shows a nozzle 401, a pin 405, a target object 408, heaters 409a and 409b acting as heating sections, and a gas port 411. A driving section for the ascent, descent, and horizontal movements of the nozzle 401, the pin 405, the target object 408, and so on is similar to the paste applicator 100 of FIG. 2 illustrated in the first embodiment.

The nozzle 401 and the pin 405 are similar to the nozzle 121 and the pin 125 of the first embodiment. Further, the nozzle 401 and a driving mechanism for moving the pin 405 and the target object 408 relative to the nozzle 401 are similar to the nozzle and the mechanism of FIG. 2. The second embodiment is different from the first embodiment only in the provision of a device and the like for releasing inert gas g from around a discharge opening 400 of the nozzle 401.

Paste 200 put into the nozzle 401 is composed of solder powder 200a contained in resin 200b. By heating the paste 200 to at least the melting point of the solder powder 200a by the heater 409a provided outside the nozzle 401, the paste 200 becomes solder 500, in which the solder powder 200a is melted, around the discharge opening 400 in the nozzle 401.

The molten solder 500 is protruded from the discharge opening 400 of the nozzle 401 to the outside of the nozzle 401 to form a solder bump on the target object 408. The solder 500 (solder ball) protruded from the discharge opening 400 to the outside of the nozzle 401 is oxidized only by simply increasing the temperature with the heater 409a. Oxidation may cause a poor solder joint in the subsequent bonding step. Thus in the second embodiment, for protection from oxidation, the oxygen-free gas g is passed between the heater 409a and the nozzle 401 and is released from the gas port 411 disposed around the discharge opening 400.

The heater 409b is provided under the target object 408. When the target object 408 has a low temperature, the molten solder is rapidly cooled and a hemispherical solder ball cannot be obtained. In the second embodiment, the heater 409b heats the target object 408 beforehand, thereby forming a solder bump with a satisfactory shape.

In this case, the gas g has to be oxygen-free gas. Inert gas is preferably used. For example, nitrogen gas and argon gas may be used.

Referring FIGS. 6A to 6D, the following will describe a process of forming a solder ball.

Figure 6A:
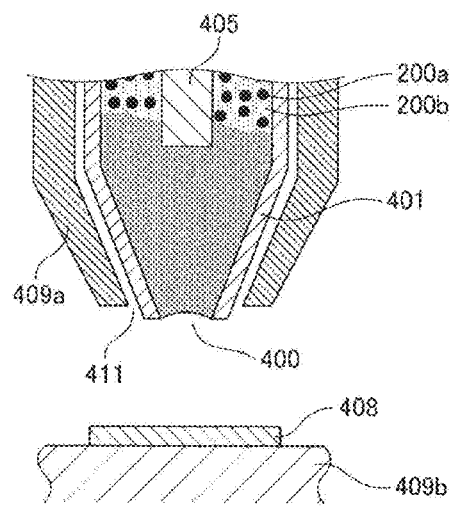
FIG. 6A is a sectional view showing an operation of applying paste according to the embodiment.

As shown in FIG. 6A, the paste 200 is supplied beforehand in the nozzle 401 disposed on a standby position immediately above the target object 408, and the pin 405 is inserted into the paste 200 and is disposed on an upper position.

In the paste 200 used for the application, the resin 200b contains the solder powder 200a having an average particle diameter of 20 μm with a compounding ratio of 50 wt % and the paste 200 has a viscosity of 20 Pa·s.

Further, on the nozzle 401, the discharge opening 400 having a bore of 0.3 mm is formed by thermoforming the end of a glass tube having a bore of 1.9 mm into a tapered shape and cutting the end into a flat shape.

In this state, the molten solder 500 having been heated by the heater 409a is kept slightly dented into the nozzle 401 from the discharge opening 400 by the action of a surface tension. Thus the solder 500 is stably retained inside the nozzle 401 without dripping or leaking from the discharge opening 400.

The end of the pin 405 is illustrated as a round bar with an even thickness in FIGS. 5 and 6A to 6D. In this configuration, the end of the pin 405 includes tapered portions which are connected and gradually reduced in diameter downward as shown in FIG. 3A. The end of the pin 405 is 0.3 mm in diameter.

Figure 6B:
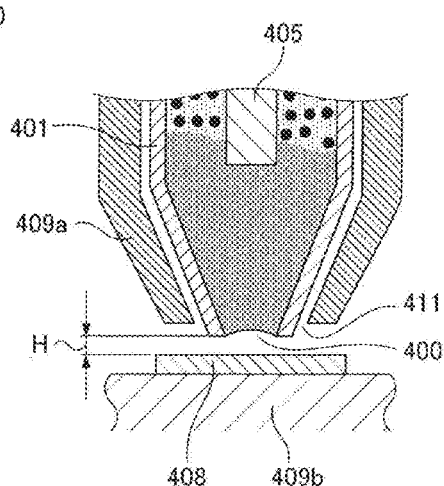
FIG. 6B is a sectional view showing the operation of applying the paste according to the embodiment.

Next, as shown in FIG. 6B, the nozzle 401 and the pin 405 are set at an application height where the discharge opening 400 is disposed at a distance H from the surface of the target object 408, by a descent of the elevator mount 115. The pin 405 can move without coming into contact with the nozzle 401. The internal space of the nozzle 401 is sufficiently larger than the pin 405.

The distance H is a dimension from the top surface of the target object 408 to the discharge opening 400 and is set at 0.15 mm corresponding to a half of the bore of the discharge opening 400. The determination of the distance H will be described later.

Figure 6C:
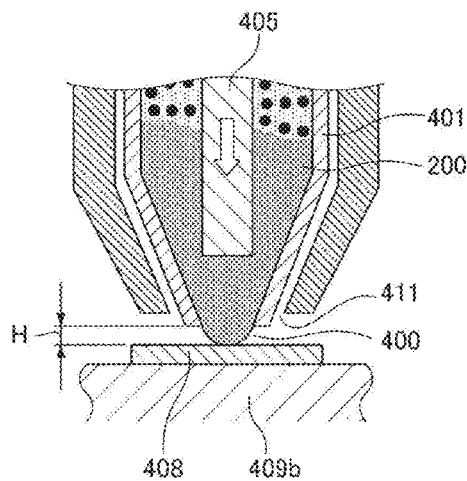
FIG. 6C is a sectional view showing the operation of applying the paste according to the embodiment.

Next, as indicated by an arrow in FIG. 6C, the pin 405 is moved down through the solder 500 at a velocity V2, so that a force increasing the fluid pressure of the solder 500 is applied under the pin 405 in synergy with the cylindrical shape of the nozzle 401 having the discharge opening 400 on the tapered end. The increased fluid pressure protrudes the solder 500 from the discharge opening 400 to the outside of the nozzle 401 and the end of the solder 500 comes into contact with the target object 408. Since the pin 405 does not come into contact with the discharge opening 400, the size of the pin 405 hardly affects the application conditions. At this point, the end of the pin 405 is not protruded out of the nozzle 401 but is placed only 1 mm above the discharge opening 400.

The distance H is 0.15 mm corresponding to a half of 0.3 mm which is the bore of the discharge opening 400, so that the solder 500 substantially becomes hemispherical, which is a satisfactory shape, immediately before the solder 500 is protruded from the discharge opening 400 to the outside of the nozzle 401 and comes into contact with the target object 408. Further, the solder 500 protruding from the discharge opening 400 to the outside of the nozzle 401 is surrounded by oxygen-free inert gas such as nitrogen gas released from the gas port 411 and does not come into contact with oxygen, so that oxidation can be prevented.

The setting of the distance H is determined according to the shape of the solder 500 immediately before the solder 500 protrudes from the discharge opening 400 to the outside of the nozzle 401 and comes into contact with the target object 408. The shape of the solder 500 is changed by a fluid pressure immediately before the solder 500 protrudes from the discharge opening 400 to the outside of the nozzle 401 and comes into contact with the target object 408. A high fluid pressure forms a shape grown from a hemisphere and thus the solder 500 is likely to drip. A low fluid pressure forms a shape smaller than the hemisphere, resulting in an unstable shape. Further, according to solder bumps to be formed, a number of parameters including the properties of the paste, the shape of the nozzle 401, the bore of the discharge opening 400, the shape and size of the pin 405, and the velocity V2 of the pin 405 are determined. At least the distance H is desirably not larger than the bore of the discharge opening 400.

Figure 6D:
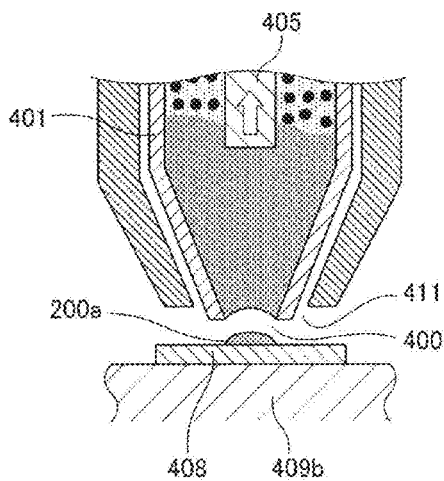
FIG. 6D is a sectional view showing the operation of applying the paste according to the embodiment.

Next, as shown in FIG. 6D, the pin 405 is moved at a velocity V1 and returned to the upper position in the paste 200. Since the pin 405 includes the tapered portions which are connected and gradually reduced in diameter downward, the pin 405 receives a larger resistance in an upward movement than in a downward movement. Thus the solder 500 is retracted by force into the nozzle 401 as the pin 405 moves up, so that the end of the solder 500 applied in contact with the target object 408 is divided by the discharge opening 400. The application is completed thus. The solder 500 applied onto the target object 408 is also surrounded by the inert gas g released from the gas port 411 and does not come into contact with oxygen, so that oxidation can be prevented.

The pin 405 is moved up and down at a constant velocity. Also in the case where the pin 405 was moved up at a higher velocity with no air bubbles entering from the discharge opening 400 of the nozzle 401, the solder 500 was retracted by force into the nozzle 401 as the pin 405 moved up, so that the solder 500 applied in contact with the target object 408 was more quickly divided by the discharge opening 400.

The pin 405 was moved down at a velocity of 2 mm/second. When the pin 405 was moved up at a velocity of 4 mm/second, the solder was satisfactorily divided and was applied with high accuracy. It is preferable that the ascending velocity is at least twice the descending velocity but air suction from the discharge opening 400 should be prevented to eliminate air bubbles entering the paste 200. The absolute value of the velocity is affected by the viscosity and so on of the solder 500 and the velocity ratio of the ascent and descent is preferably at least 2 to 1.

The solder 500 retracted into the nozzle 401 has a self weight and a surface tension in balance and returns to the state of FIG. 6B.

Figure 8:
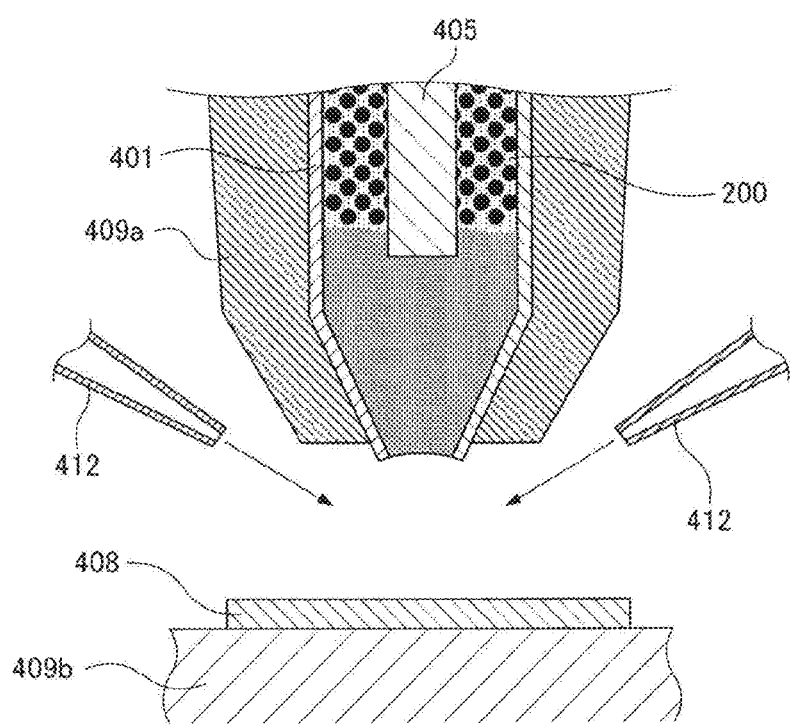
FIG. 8 is a side view around the nozzle of the paste applicator according to the embodiment.
Figure 9A:
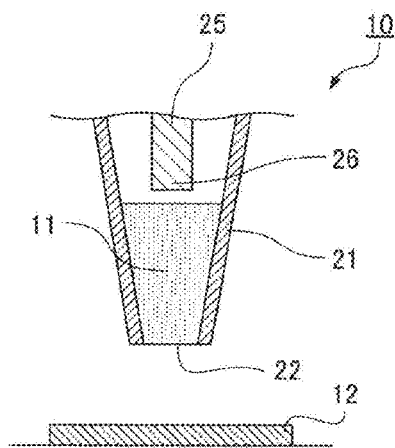
FIG. 9A is a sectional view showing that Japanese Patent Laid-Open No. 2006-320795 is applied to a paste applicator.
Figure 9B:
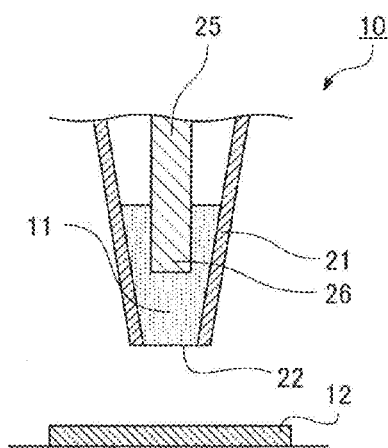
FIG. 9B is an explanatory drawing showing an application process used for the paste applicator.
Figure 9C:
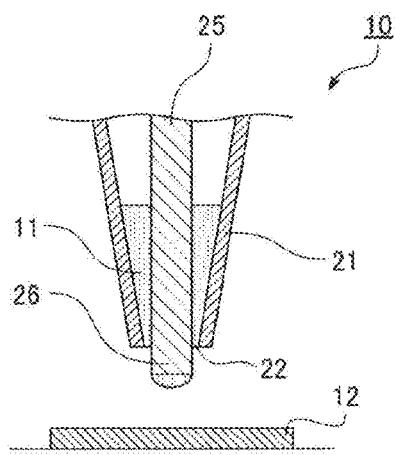
FIG. 9C is an explanatory drawing showing the application process used for the paste applicator.
Figure 9D:
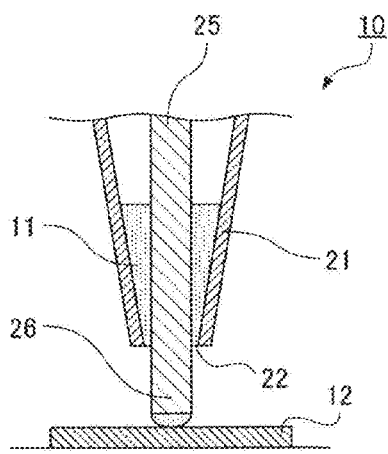
FIG. 9D is an explanatory drawing showing the application process used for the paste applicator.
Figure 11A:
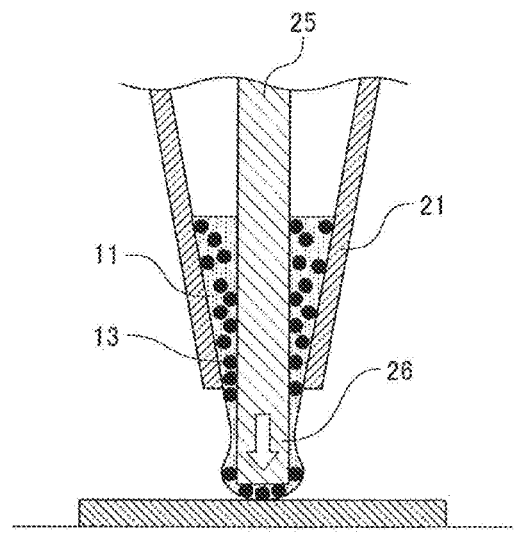
FIG. 11A is a sectional view showing the problem of an increasing amount of application.
Figure 11B:
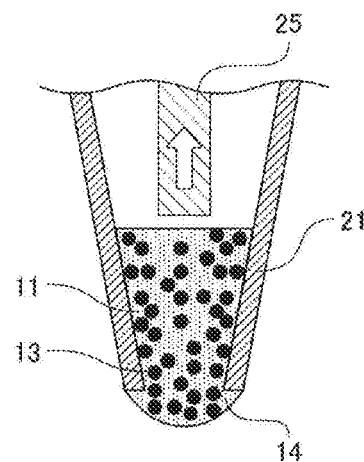
FIG. 11B is a sectional view showing the problem of an increasing amount of application.
Figure 11C:
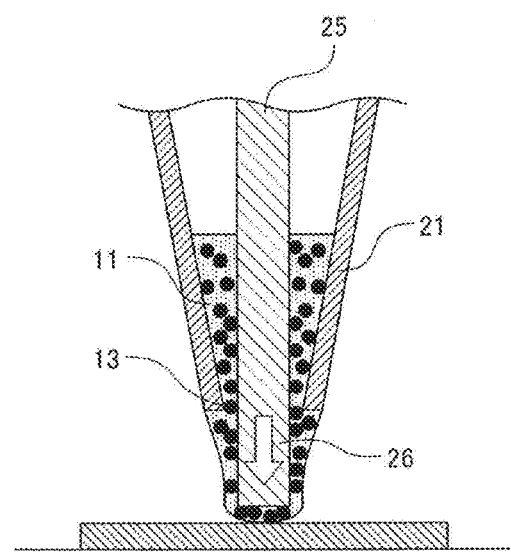
FIG. 11C is a sectional view showing the problem of an increasing amount of application.

In this case, on the solder 500 immediately before the solder 500 protrudes from the discharge opening 400 to the outside of the nozzle 401 and comes into contact with the target object 408 and on the solder 500 applied onto the target object 408, oxidation is prevented by the inert gas g released from the gas port 411. As shown in FIG. 8, oxidation may be prevented by a gas pipe 412 which is provided around the nozzle 401 instead of the gas port 411 to release the inert gas g.

The solder 500 having been transferred and applied onto the target object 408 forms a bump having a diameter of about 0.3 mm and a height of about 0.1 mm.

The distance H between the nozzle 401 and the target object 408 is preferably 0.5 times to 1.5 times as large as the diameter of the discharge opening. When the distance is smaller than this range, the solder 500 is expanded. When the distance H is larger than this range, it is necessary to increase the amount of the solder 500 protruding from the discharge opening 400 to the outside of the nozzle 401.

As has been discussed, the solder powder 200a does not enter a clearance between the pin 405 and the discharge opening 400 or the amount of application does not become unstable. Thus a small amount of solder can be stably applied to the target object 408 such as a substrate.

Figure 7:
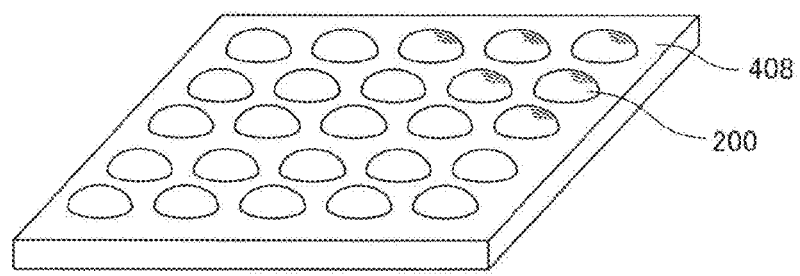
FIG. 7 is an enlarged perspective view showing a fabricated product.

The solder 500 is repeatedly applied to various points, so that a number of solder bumps can be formed on the target object 408 as shown in FIG. 7. When the target object 408 is a semiconductor IC element, solder bumps arranged thus are necessary and solder can be repeatedly applied to various points for all kinds of bump formation on a semiconductor IC element. This arrangement is applicable to, for example, a semiconductor IC element of a memory and a semiconductor IC element of a control system and is further applicable to bump formation for joining the electrodes of substrates. Moreover, this arrangement is applicable to a central processing unit of a workstation, communication equipment, and a semiconductor IC element mounted on a vehicle. Furthermore, this arrangement is applicable to a preamplifier of a hard disk drive, a large-capacity semiconductor, and so on. Also in the first embodiment, a small amount of paste can be applied to a number of points on the target object 408 as illustrated in FIG. 7.

In the second embodiment, the solder powder is used as a filler contained in paste used for application. The present invention is not limited by the material, particle diameter, and shape of the filler, a compounding ratio, the viscosity of the paste, and so on. Further, the present invention is also applicable to a liquid containing no fillers.

In the second embodiment, the nozzle 401 is brought close to the target object 408. The target object 408 may be moved relative to the nozzle 401 or both of the nozzle 401 and the target object 408 may be moved. The second embodiment can be realized by a relative movement of the nozzle 401 and the target object 408.

In the second embodiment, oxidation is prevented by releasing the inert gas g from the gas port 411 and the like. The inside of the applicator may be entirely in an inert atmosphere. The target object 408 is stored into the applicator, the solder 500 is applied, and then the target object 408 is removed from the applicator, so that bumps can be formed in the inert atmosphere.

The present invention can stably apply a small amount of paste in the manufacturing process of a semiconductor IC element and the like, thereby contributing to an increase in the yield of the semiconductor IC element and so on.

What is claimed is:

1. A paste dispenser comprising:
   a nozzle which has a discharge opening formed on an end, is disposed above a target object with the discharge opening placed at a bottom of said nozzle, and said nozzle is filled with paste containing fillers, with an inside of the nozzle having a shape tapered toward the discharge opening, wherein at least one of the nozzle and the target object moves to decrease or increase a distance between the nozzle and the target object; said nozzle is placed in an elevator mount, said elevator mount raises and lowers the nozzle, and
   a pin which is disposed in the nozzle, and which moves toward and away from the discharge opening, an end of the pin being smaller than the discharge opening, a space being defined between the pin and an inner periphery of the discharge opening so the pin does not contact the inner periphery of the discharge opening, wherein the end of the pin does not protrude from the discharge opening to an outside of the nozzle; an upper end of said pin is attached to a slider, said pin is moved up and down by movement of the slider up and down,
   wherein the pin is configured to approach the discharge opening so as not to drip the paste from the discharge opening when the discharge opening of the nozzle approaches the target object, and separate the paste in contact with the target object from the paste around the discharge opening, by moving the pin away from the discharge opening in synchronization with a movement increasing a distance between the nozzle and the target object when the paste protruded toward the target object from the nozzle is in contact with the target object;
   wherein said pin is configured to move away from the discharge opening at a velocity at least twice a velocity at which the pin is moved toward the discharge opening.

2. The paste dispenser according to claim 1, wherein at a position where the discharge opening of the nozzle is close to the target object, a height from a surface of the target object to the discharge opening is in a range from 0.5 times to 1.5 times as large as a bore of the discharge opening.

3. The paste dispenser according to claim 1, wherein the pin has an end shaped such that a larger resistance is applied from the paste when the pin is moved away from the discharge opening than when the pin is moved toward the discharge opening.

4. A paste dispenser comprising:
   a nozzle which has a discharge opening formed on an end, with an inside of the nozzle having a shape tapered toward the discharge opening, is disposed above a target object with the discharge opening placed at a bottom of said nozzle, and said nozzle is filled with paste containing fillers, and said nozzle is moved toward and away from the target object;

a pin which is disposed in the nozzle, and said pin moves toward and away from the tapered shape of the discharge opening, wherein an end of the pin does not protrude from the discharge opening to an outside of the nozzle, a space being defined between the pin and an inner periphery of the discharge opening so the pin does not contact the inner periphery of the discharge opening; an upper end of said pin is attached to a slider, said pin is moved up and down by movement of the slider up and down, an elevator mount for raising and lowering the nozzle and the pin;

a first heater which heats the paste containing the fillers in the nozzle to at least a melting point of the filler; and a port for discharging an inert gas disposed around a periphery of the discharge opening of the nozzle, wherein the pin is configured to approach the discharge opening so as not to drip the paste from the discharge opening when the discharge opening of the nozzle approaches the target object and separate the pin in contact with the target object from the paste around the discharge opening, by moving the pin away from the discharge opening in synchronization with a movement increasing a distance between the nozzle and the target object when the paste protruded toward the target object from the nozzle is in contact with the target object; wherein said pin is configured to move away from the discharge opening at a velocity at least twice a velocity at which the pin is moved toward the discharge opening.

5. The paste dispenser according to claim 4, wherein the pin has an end shaped such that a larger resistance is applied from the paste when the pin is moved away from the discharge opening than when the pin is moved toward the discharge opening.

6. The paste dispenser according to claim 4, wherein at a position where the discharge opening of the nozzle is close to the target object, a height from a surface of the target object to the discharge opening is in a range from 0.5 times to 1.5 times as large as a bore of the discharge opening.

7. The paste dispenser according to claim 1, wherein the target object is moved toward and away from the nozzle.

8. The paste dispenser according to claim 1, wherein when the nozzle is moved toward the target object, the target object is moved toward the nozzle, and when the nozzle is moved away from the target object, the target object is moved away from the nozzle.

9. The paste dispenser according to claim 1, wherein an end shape of the pin is columnar and recessed portions are circumferentially-formed on the end of the pin.

10. The paste dispenser according to claim 1, wherein an end of the pin has a plurality of tapered shapes toward the end of the pin, the plurality of tapered shapes being stacked in an axial direction.

11. The paste dispenser according to claim 4, wherein the first heater is provided an outer periphery of the nozzle, and the inert gas is passed between the first heater and the nozzle.

12. The paste dispenser according to claim 4, wherein a second heater is provided under the target object.

* * * * *